United States Patent

[11] 3,587,091

[72] Inventor John J. L. Cooper
Lewisham, England

[21] Appl. No. 744,865
[22] Filed July 15, 1968
[45] Patented June 22, 1971
[73] Assignee Elliott Brothers (London) Limited
London, England

[54] DIGITAL TO ANALOGUE CONVERSION
2 Claims, 2 Drawing Figs.

[52] U.S. Cl. .......... 340/347
[51] Int. Cl. .......... H03k13/02, H03k 13/10
[50] Field of Search .......... 340/347

[56] References Cited

UNITED STATES PATENTS

| | | | |
|---|---|---|---|
| 3,365,713 | 1/1968 | Avignon | 340/347 |
| 3,419,819 | 12/1968 | Murakami | 340/347 |
| 3,430,225 | 2/1969 | Avignon | 340/347 |
| 3,439,271 | 4/1969 | Metcalf | 340/347 |
| 3,462,758 | 8/1969 | Reynal | 340/347 |
| 3,480,948 | 11/1969 | Lord | 340/347 |

*Primary Examiner*—Maynard R. Wilbur
*Assistant Examiner*—Jeremiah Glassman
*Attorney*—Smith, Michael, Bradford and Gardiner

ABSTRACT: A digital to analogue converter comprises a resistor ladder which produces an intermediate analogue signal dependent on a digital input signal. A comparator compares the intermediate analogue signal with the charge on a capacitor in a selected output channel, and adjusts the charge, by means of a current source and a current sink, until the charge represents the value of the intermediate analogue signal.

INVENTOR
JOHN J.L. COOPER
BY [signature]
ATTORNEYS

INVENTOR
JOHN J.L. COOPER
BY Smith, Michael, Bradford & Gardiner
ATTORNEYS

DIGITAL TO ANALOGUE CONVERSION

The invention relates to digital to analogue conversion.

According to the invention, there is provided a digital to analogue converter system, comprising input means for receiving a digital signal, means responsive to the digital signal to produce an intermediate analogue signal representative thereof, and control means responsive to the intermediate analogue signal and operative to adjust the value of a stored signal in dependence thereon whereby the stored signal is the analogue of the said digital signal.

According to the invention, there is also provided a digital to analogue converting system, comprising first input means for receiving a digital signal, a plurality of output means, second input means operative to select a desired one of said output means, means responsive to the digital signal to produce an intermediate analogue signal representative thereof, and control means responsive to the said intermediate analogue signal and operative to adjust the value of a stored signal in the selected said output means in dependence thereon, whereby the stored signal represents the analogue of the said digital signal.

A digital to analogue converter system embodying the invention will now be described by way of example with reference to the accompanying drawings in which.

Figure 1:
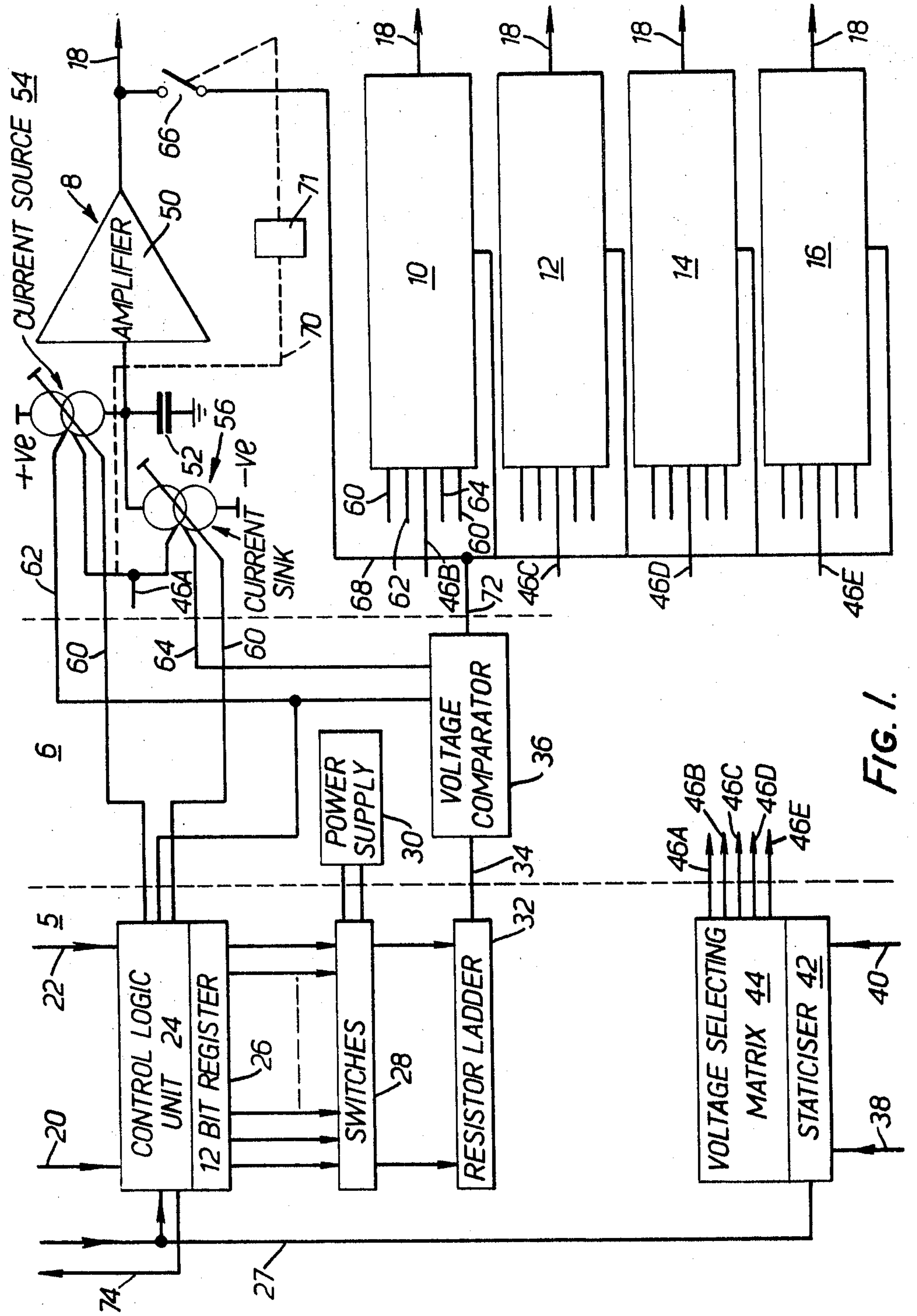
FIG. 1 is a schematic block circuit diagram of the converter system.

The converter system comprises input circuitry 5, control circuitry 6, and five identical output channels 8 to 16. In operation, a digital signal to be converted into analogue form, and the address of the particular one of the five channels 8 to 16 from which the analogue output is to be produced, are fed into the input circuitry 5; the converter system then operates in a manner to be described so as to produce the corresponding analogue output on the appropriate one of five output lines 18.

The input circuitry 5 comprises a plurality of data input lines, of which lines 20 and 22 are examples, which are connected to a control logic unit 24 and thence to a 12-bit storage register 26. A 12-bit two's-complement binary data input signal to be converted into analogue form is applied to the lines 20 and 22 and is fed into the register 26 when an initiate line 27 is energized. The register 26 is connected to control the setting of a set of precision switches 28 so that the switches are set according to the states of the various stages of the register. The switches 28 are connected to a precision power supply 30, and control the energization of a resistor ladder network 32. The resistor ladder network comprises an array of resistors whose values are related to each other in the manner of a binary sequence, and the switches 28 so connect the resistors in circuit with the power supply 30 that the total output voltage from the network 32 on a line 34 is the analogue of the digital signal stored in the register 26. The analogue voltage signal on the line 34 is fed into a voltage comparator 36.

The input circuitry 5 also includes two address input lines 38 and 40 for receiving a 5-bit binary signal representing the address of the one of the five channels 8 to 16 from which the analogue output is to be produced. When the initiate line 27 is energized, the 5-bit signal on the lines 38 and 40 is fed into a staticizer unit 42 which controls a voltage selecting matrix 44 so as to produce a channel select signal on an appropriate one of five lines 46A to 46E representing the addressed channel 8 to 16. The lines 46A to 46E are connected respectively to the five channels 8 to 16.

The output channel 8 will now be described, the channels 10 to 16 being similar.

The channel 8 comprises an amplifier 50 having a low output impedance and a high input impedance and having a capacitor 52 connected to its input. One plate of the capacitor 52 is connected to earth. The charge on the capacitor 52 is controlled by a two-rate current source device 54 and a two-rate current sink device 56. The current source device 54 is a gating device (such as a transistor) connected between the positive terminal of a power supply and the capacitor. When activated, the source device 54 allows current to flow into the capacitor to increase its charge. Similarly, the current sink device 56 is a gating device such as a transistor but is connected between the negative terminal of the power supply and the capacitor. When activated, the sink device 56 causes charge to leak away from the capacitor. The devices 54 and 56 are connected to the line 46A from the voltage selecting matrix 44 and can only be activated when this line is energized. The devices 54 and 56 are respectively connected by rate control lines 60 to the control logic unit 24. The devices 54 and 56 are activated by means of respective control lines 62 and 64 which are connected to the voltage comparator unit 36.

The lines 60, 62 and 64 are also connected to the channels 10 to 16 by connections omitted from FIG. 1 for clarity.

The lines 60 control the rates of operation of the devices 54, 56. When the lines 60 are energized, energization of line 62 will cause a high rate of charging of the capacitor 52 and energization of line 64 will cause a high rate of discharging of the capacitor. When the lines 60 are not energized, energization of line 62 will cause a slow rate of charging of the capacitor 52 and energization of line 64 will cause a slow rate of discharging of the capacitor. As explained, neither device can be activated at all unless the line 46A is energized, and it will be appreciated that the devices 54 and 56 in any other channel cannot be activated at all until the appropriate line 46B to 46E is energized.

The lines 62 and 64 carry complementary signals so that only one of the devices 54, 56 in the selected channel can be activated in any given time.

Each channel includes a respective switch 66 connected between the output line 18 of the channel and a common feedback bus bar 68, the switch 66 in each channel only being closed when the appropriate one of the lines 46A to 46E is energized as indicated diagrammatically by the dotted line 70 and switch operating device 71. The bus bar 68 is connected to the voltage comparator 36 by a line 72.

The operation of the converter system will now be described.

The 12-bit binary signal to be converted into analogue form is applied to the lines 20 and 22, and the address signal indicating the channel 8 to 16 from which the analogue output is to be produced is supplied on the lines 38 and 40; it will be assumed that the address signal is the address of the channel 8. The initiate line 27 is then energized so as to feed the data input through the control logic unit 24 into the 12-bit register 26 and so as to feed the address input into the staticizer unit 42. When the data input and the address input have been fed in in this way, a reply signal is produced on a line 74 as an acknowledgement.

The voltage selecting matrix 44 responds to the staticizing unit 42 by energizing line 46A (since the address fed in is that of channel 8) so as to close the switch 66 in channel 8 and to place the devices 54 and 56 of channel 8 into a condition in which they can be activated. The closing of the switch 66 connects the output of the amplifier 50 to the feedback bus bar 68.

The energization of the initiate line 27 causes the control logic unit 24 to energize the rate control lines 60 and these lines remain energized thereafter for at least a predetermined time delay as will be explained further.

In the manner described, the data stored in the register 26 sets the switches 28 such that the voltage signal on the line 34 represents, in analogue form, the digital signal stored in the register. The voltage comparator 36 then compares the voltage on the line 34, which represents the desired analogue output, with the actual output voltage on the line 18 of the channel 8. If the output voltage on the line 18 is lower than the desired analogue output on the line 34, the line 62 is energized and the line 64 is deenergized. The source device 54 is thus activated and, because the rate lines 60 are also energized, the device 54 causes the capacitor 52 to be charged at a high rate. The sink device 56 remains unactivated. As the capacitor charge increases, the output voltage on the line 18 also increases, substantially linearly, until it becomes greater than the desired value on the line 34. This condition is detected by the comparator 36 which deenergizes the line 62 and energizes the line 64. The device 56 therefore causes the capacitor to be discharged, the device 54 being deactivated. The output of the amplifier 50 therefore falls. When the output has fallen below the desired value on the line 34, the comparator once more energizes the line 62 and deenergizes the line 64, so as to cause the charge on the capacitor 52 to be increased again. This process is repeated for so long as the channel remains selected. However, as soon as the predetermined time delay set in the control logic unit 24 has elapsed, the next change in the state of the lines 62 and 64 produced by the comparator 36 causes the unit 24 to deenergize the lines 60 which remain deenergized until the initiate line 27 is next energized (that is, when a further data signal is fed into the system). Therefore, all subsequent charging and discharging of the capacitor 52 take place at the slow rate.

Figure 2:
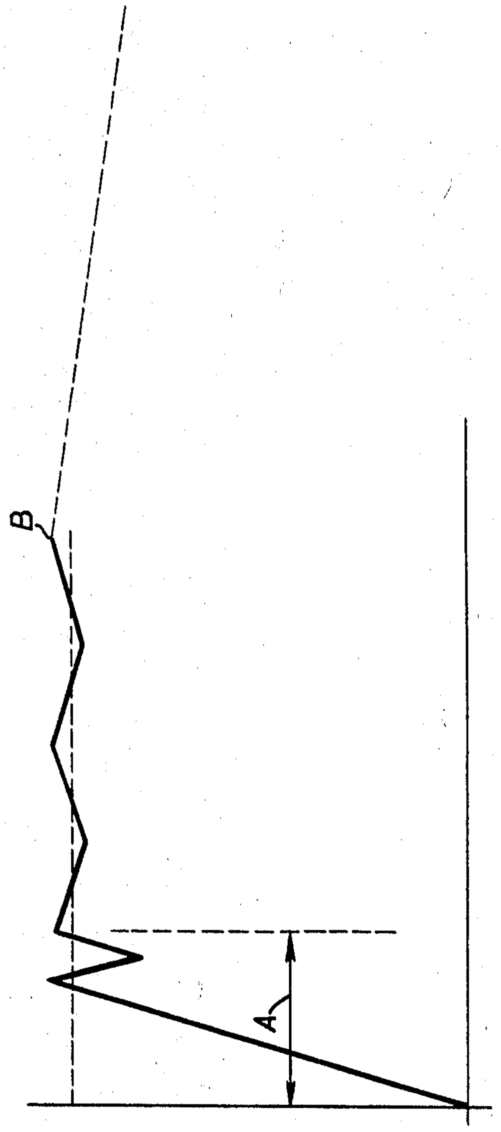
FIG. 2 shows a waveform occurring in the system.

In the manner described above, therefore, the output from the channel 8 on the line 18 is varied closely about the desired value. FIG. 2 illustrates, diagrammatically, the waveform of the voltage output on the line 18 of the channel 8. FIG. 2 shows the initial period A during which the rate control lines 60 are energized. During this period, the rate of charging and discharging of the capacitor is high so as to bring the voltage on the line 18 rapidly to the desired value. At the end of the period A, the lines 60 are deenergizes as described, and the voltage on the line 18 is thereafter controlled closely to the desired value, the rate of charging and discharging of the capacitor being slow.

The process continues in this way until the channel 8 is deselected as indicated at the point B in FIG. 2 whereafter the charge on the capacitor 52 slowly leaks away through the amplifier 50 thus causing the output on the line 18 to decay slowly.

By sequentially changing the address inputs supplied to the lines 38 and 40, two or more of the output channels can be selected in sequence. The rapidity at which the charge on the capacitor 52 in the selected channel is brought to the correct value, and the slow rate of decay of charge when the channel is deselected, are such that the lines 18 of these sequentially selected channels carry substantially correct outputs continuously.

As many output channels as desired may be connected into the system, provided that the voltage matrix 44 is made capable of supplying the requisite number of selecting signals and that the voltage comparator 36 is able to supply the requisite error signals.

By using a current source in the final stage of the amplifiers 50, the outputs on the lines 18 are made immune to short circuits to earth.

What I claim is:

1. A digital to analogue converter system comprising input means for receiving a digital signal, means responsive to the digital signal to produce on intermediate analogue signal representative thereof, a plurality of output means each comprising respective capacitive storing means producing a variable output signal representing the charge in the capacitive storing means, current source means connected to the capacitive storing means and operative when activated to increase the said charge, and current sink means connected to the capacitive storing means and operative when activated to decrease the said charge, comparing means responsive to the intermediate analogue signal, selecting means responsive to an address signal representative of any particular one of said output means and operative to connect the said comparing means to the selected output means so that the comparing means is responsive also to the variable output signal therefrom and produces an error signal dependent on the difference between the two signals compared, and control means responsive to the error signal to activate such one of the current source means and the current sink means in the selected output means as tends to reduce the error signal to zero whereby the output signal is the analogue of the said digital signal.

2. A system according to claim 1, including means operative to increase the rate of charging of the current source means and the rate of discharge of the current sink means for a period during which the said error signal tends to be high.